(12) United States Patent
Kobayashi

(10) Patent No.: US 7,439,805 B1
(45) Date of Patent: Oct. 21, 2008

(54) ENHANCEMENT-DEPLETION DARLINGTON DEVICE

(75) Inventor: Kevin W. Kobayashi, Torrance, CA (US)

(73) Assignee: RF Micro Devices, Inc., Greensboro, NC (US)

(*) Notice: Subject to any disclaimer, the term of this patent is extended or adjusted under 35 U.S.C. 154(b) by 126 days.

(21) Appl. No.: 11/422,928

(22) Filed: Jun. 8, 2006

(51) Int. Cl.
*H03F 3/16* (2006.01)

(52) U.S. Cl. .................. 330/277; 330/296; 330/310

(58) Field of Classification Search ............... 330/277, 330/283, 285, 296, 310
See application file for complete search history.

(56) References Cited

U.S. PATENT DOCUMENTS

| | | | |
|---|---|---|---|
| 4,845,386 A | 7/1989 | Ueno | 307/446 |
| 4,876,516 A | 10/1989 | Dougherty | 330/54 |
| 5,045,726 A | 9/1991 | Leung | 307/466 |
| 5,047,731 A | 9/1991 | Lee | 330/282 |
| 5,128,741 A | 7/1992 | Arnborg | 357/43 |
| 5,838,031 A | 11/1998 | Kobayashi et al. | 257/197 |
| 6,437,612 B1 * | 8/2002 | Dasgupta et al. | 330/260 |
| 7,193,477 B2 * | 3/2007 | Chang et al. | 330/306 |

OTHER PUBLICATIONS

RF Nitro Communications, Inc., GaInP/GaAs HBT MMIC Distributed Amplifier, pp. 88-92.
Agilent Technologies, Agilent HMMC-5200 DC-20 GHz HBT Series-Shunt Amplifier, Oct. 10, 2003, pp. 1-6.
WJ Communications, Inc. AH1 High Dynamic Range Amplifier, Jun. 2005, pp. 1-6.

* cited by examiner

*Primary Examiner*—Khanh V Nguyen
(74) *Attorney, Agent, or Firm*—Withrow & Terranova, PLLC

(57) ABSTRACT

An apparatus comprising a Darlington transistor pair comprising a first transistor and a second transistor. The first transistor may have a gate configured to receive an input signal. The second transistor may have a gate coupled to a source of the first transistor. The Darlington transistor pair may be configured to generate an output signal at a drain of the first transistor and a drain of the second transistor in response to the input signal. The first transistor may be implemented as an enhancement mode device and the second transistor may be implemented as a depletion mode device.

19 Claims, 14 Drawing Sheets

E-mode-D-mode PHEMT DARLINGTON

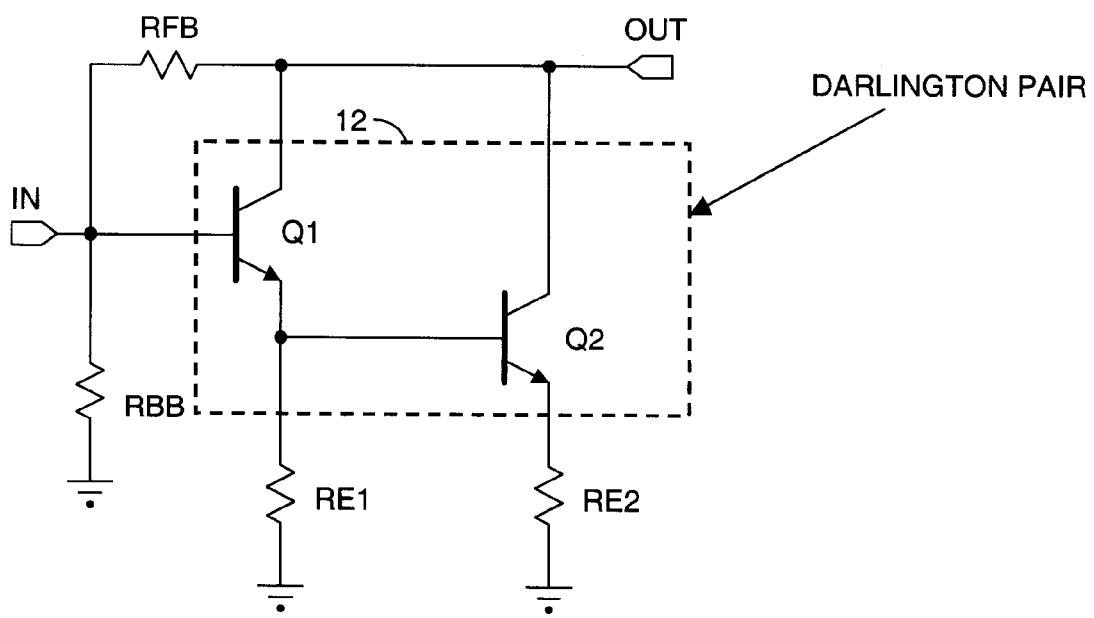
(CONVENTIONAL)
FIG. 1

ENHANCEMENT-DEPLETION DARLINGTON DEVICE

FIELD OF THE INVENTION

The present invention relates to amplifiers generally and, more particularly, a method and/or apparatus for implementing an enhancement-depletion Darlington device.

BACKGROUND OF THE INVENTION

Conventional Darlington amplifiers are noted for having a wide band gain and third order intercept point (IP3) response, compact size, and low cost package implementation. Darlington amplifiers typically have superior IP3-bandwidth performance compared to common-source and common-emitter feedback amplifiers. While Darlington amplifiers have advantages over single transistor feedback amplifiers, Darlington amplifiers typically suffer in output power capability due the limited output voltage swing. In particular, the lower voltage swing limit is lower by 1-Vbe, or 1 turn-on voltage, compared to a common-source or common-emitter amplifier. This extra threshold drop is due to the first stage transistor and increases the knee of a typical transistor I-V characteristic by 1 threshold turn-on voltage. As a result, the output P1dB and IP3 will be limited due to the extra threshold drop of the first stage transistor.

Referring to FIG. 1, a diagram of a conventional Darlington feedback amplifier topology 10 is shown. The topology 10 includes the usual Darlington transistor pair 12 (transistor Q1 and transistor Q2) a series feedback resistor RE2, a parallel feedback resistor RFB, and a bias resistor RE1 and a bias resistor RBB. The Darlington pair (or cell) 12 is known to have advantages over the common-emitter or common-source transistor in feedback amplifiers applications. The Darlington cell 12 can provide higher current gain and cut-off frequency, and can be designed to have a higher input impedance, which is preferred in feedback implementations.

The use of the Darlington pair 12 in feedback amplifiers results in improved IP3, Gain and bandwidth performance and can also provide higher output power capability. The drawback of the conventional Darlington topology 10 is that the knee voltage of the I-V characteristics is increased by 1 Vbe, or 1 turn-on threshold voltage, due to the presence of the transistor Q1. In a power amplifier application, the transistor Q1 of the amplifier will saturate 1 Vbe earlier than a common-emitter amplifier.

Referring to FIG. 2, a graph illustrating the difference in I-V characteristics (or current-voltage DC characteristics) of a conventional GaAs HBT Darlington with a GaAs HBT common-emitter device is shown. A common-emitter device illustrates a family of I-V curves that has a Knee voltage of around 0.3V. The Darlington configuration has a knee voltage of ~2V. The knee voltage of the Darlington is slightly greater than 1 Vbe~1.45V higher than the knee voltage of the common-emitter device as theory would predict. Therefore, the output voltage swing of the Darlington cannot swing below ~2V without saturating the first transistor Q1. Such a swing limitation inhibits the linear output power capability of a Darlington based amplifier and will impact linearity figure of merits such as IP3 and adjacent channel power rejection (ACPR) (i.e., both distortion measurements).

Referring to FIG. 3, a system 20 illustrates a modification of the Darlington feedback amplifier. An example of such a configuration may be found in (i) the Agilent HMMC-5200 20 GHz HBT Series-Shunt Amplifier data sheet, and (ii) the RF Nitro Communications Inc. NDA-212 GaInP/GaAs HBT MMIC Distributed Amplifier DC-17 GHz. The first stage collector is not connected to the output, but instead is connected to a separate supply through an optional stability resistor. The power supply is conventionally bypassed with a capacitor. The knee voltage of the I-V curves of this Pseudo-Darlington is now reduced to that of the common-emitter output transistor Q2. Such a topology is not a true Darlington because the collectors of the input and output transistors are not tied together. Therefore, the RF and functional characteristics of such a CC-CE amplifier will depart from the true Darlington feedback amplifier.

Although the knee voltage of the CC-CE amplifier is lower and should obtain better output power, such an amplifier uses an additional supply voltage. Such an additional supply voltage precludes use in popular transistor style packages which have only an input, output and ground lead, such as the SOT89, SOT86 and 76 ceramic pill packages. Additionally, the stability nature of the CC-CE topology is marginal due to the common-collector input stage. The instability of the common-collector is well known in analog design disciplines. The common collector results in a positive gain slope, which is attributed to modest positive feedback inherent to the topology. This results in positive gain slope, marginal stability, and degraded IP3 and NF performance as compared to the Darlington amplifier of FIG. 1. What is achieved by using this CC-CE topology is a larger small signal gain-bandwidth product, which is useful for small signal, low power applications. One such application that has popularized this topology is the transimpedance amplifier for fiber optic receiver applications, which uses a wide small signal bandwidth response. Although practical for small signal applications, such a system is less than optimal for linear output power applications.

It would be desirable to implement a method and/or apparatus for reducing the knee voltage and improving the output power capability of a Darlington by implementing a combination of E-mode and D-mode PHEMT devices.

SUMMARY OF THE INVENTION

The present invention concerns an apparatus comprising a Darlington transistor pair comprising a first transistor and a second transistor. The first transistor may have a gate configured to receive an input signal. The second transistor may have a gate coupled to a source of the first transistor. The Darlington transistor pair may be configured to generate an output signal at a drain of the first transistor and a drain of the second transistor in response to the input signal. The first transistor may be implemented as an enhancement mode device and the second transistor may be implemented as a depletion mode device.

The objects, features and advantages of the present invention include providing an enhancement-depletion darlington device that may (i) reduce the knee voltage of the Darlington, (ii) achieve better linear output capability than a conventional Darlington (iii) reduce the knee voltage of a Darlington to resemble a single transistor device, (iv) provide a knee voltage that is comparable to a single transistor common-source amplifier, (v) provide robustness, high linearity and IP3-bandwidth product, (vi) be implemented to reduce the knee voltage of a Darlington transistor to improve output power and IP3 performance, (vii) implement both enhancement-mode and depletion-mode devices in a Darlington configuration, (viii) implement a first stage enhancement-mode followed by a depletion-mode device to reduce knee voltage and improve output power and linearity, (ix) use of a spiral inductor on the source of the first device to provide a high RF impedance, but low DC impedance, to a branch of the signal path, (x) use of a first stage depletion-mode device followed by an enhancement-mode device to allow a DC direct-coupled input capability and/or (xi) implement an active bias scheme.

BRIEF DESCRIPTION OF THE DRAWINGS

These and other objects, features and advantages of the present invention will be apparent from the following detailed description and the appended claims and drawings in which:

FIG. 1 is a diagram illustrating a conventional Darlington feedback amplifier topology;

DETAILED DESCRIPTION OF THE PREFERRED EMBODIMENTS

The present invention uses a combination of enhancement-mode and depletion-mode devices to construct a Darlington which is not voltage swing limited as in the conventional Darlington implementations.

Figure 2:
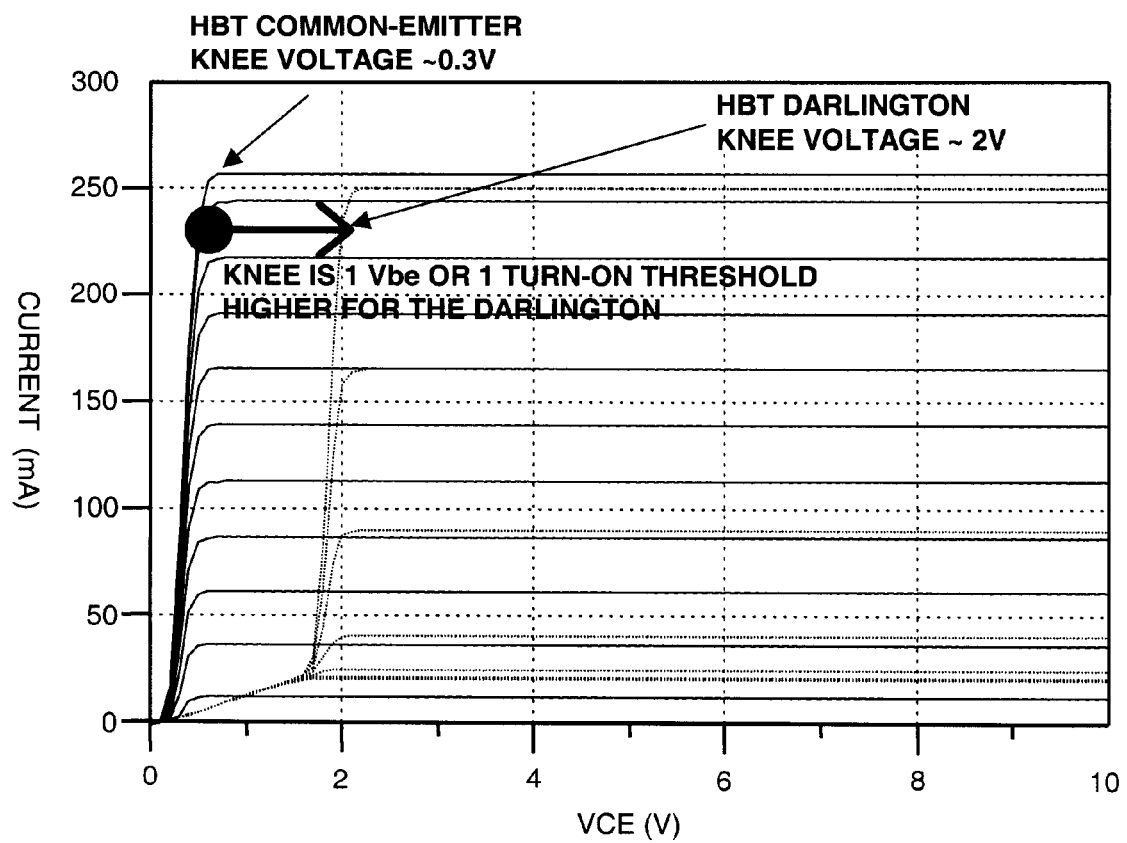
FIG. 2 is a diagram illustrating difference in I-V characteristics of the amplifier of FIG. 1.
Figure 3:
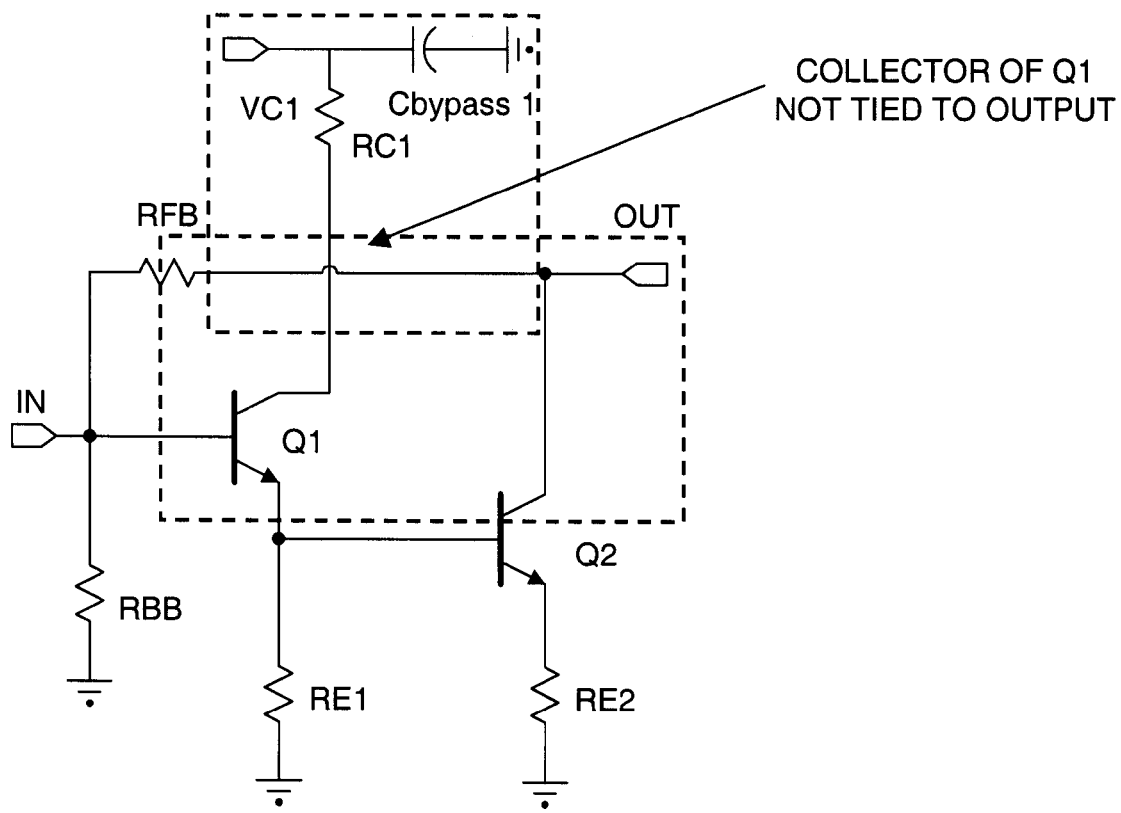
FIG. 3 is a diagram illustrating a modified Darlington feedback amplifier.
Figure 4:
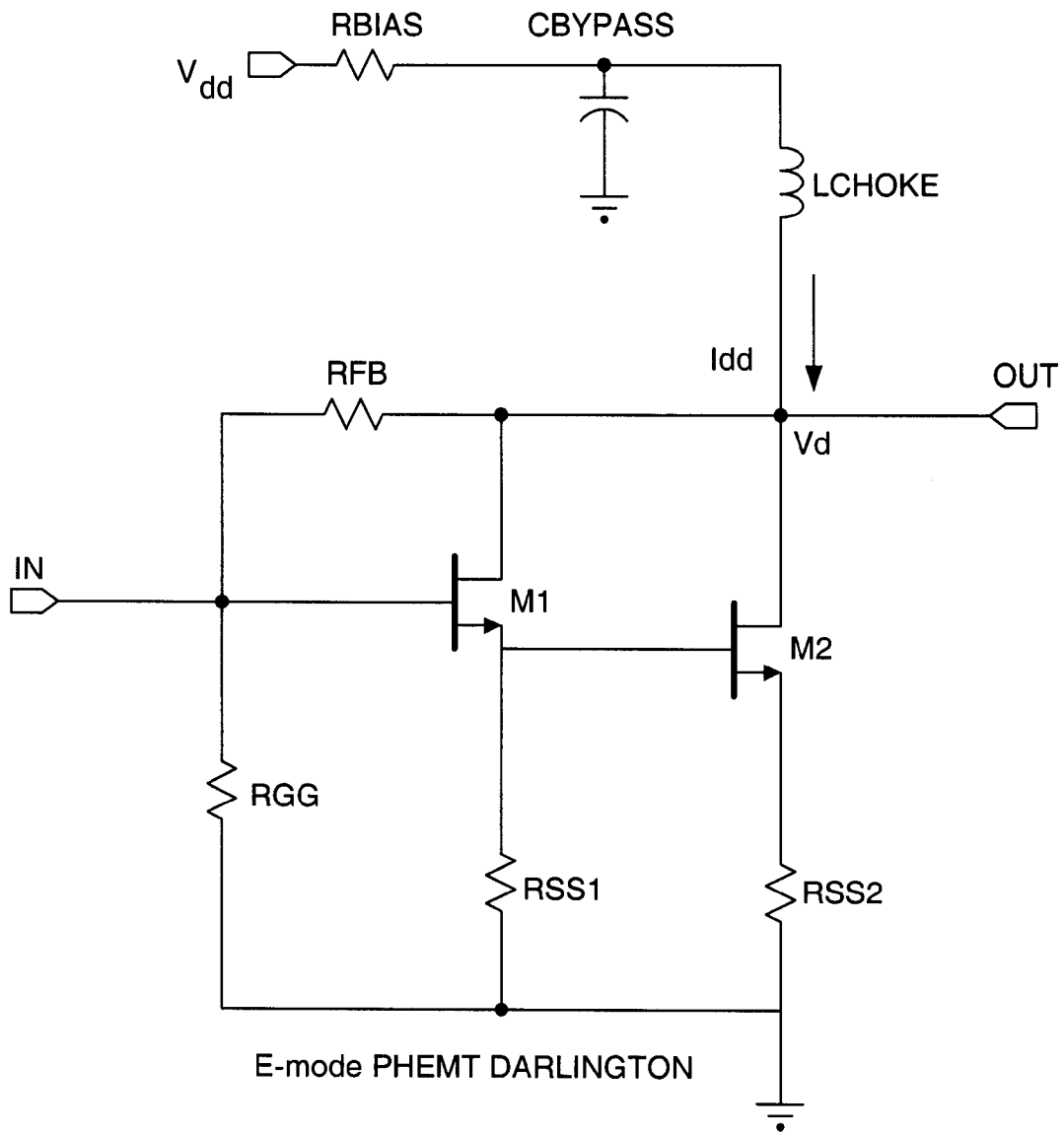
FIG. 4 is a diagram illustrating an E-mode PHEMT Darlington amplifier.

Referring to FIG. 4, a system 30 illustrating an E-mode PHEMT Darlington amplifier is shown. The system 30 shows an implementation for reducing knee voltage in a Darlington feedback amplifier. The system 30 uses low threshold voltage E-mode PHEMTs to construct a Darlington. Since the turn-on voltage of the PHEMTs are ~0.6V, the knee voltage will be reduced by ~0.7 compared to a GaAs HBT Darlington and a few tenths of a volt reduction compared to a SiGe HBT implementation. The E-mode PHEMT implementation offers other advantages over GaAs/InGaP and SiGe HBT implementations such as lower noise, lower parasitics, and higher linearity (IP3) bandwidth.

Figure 5:
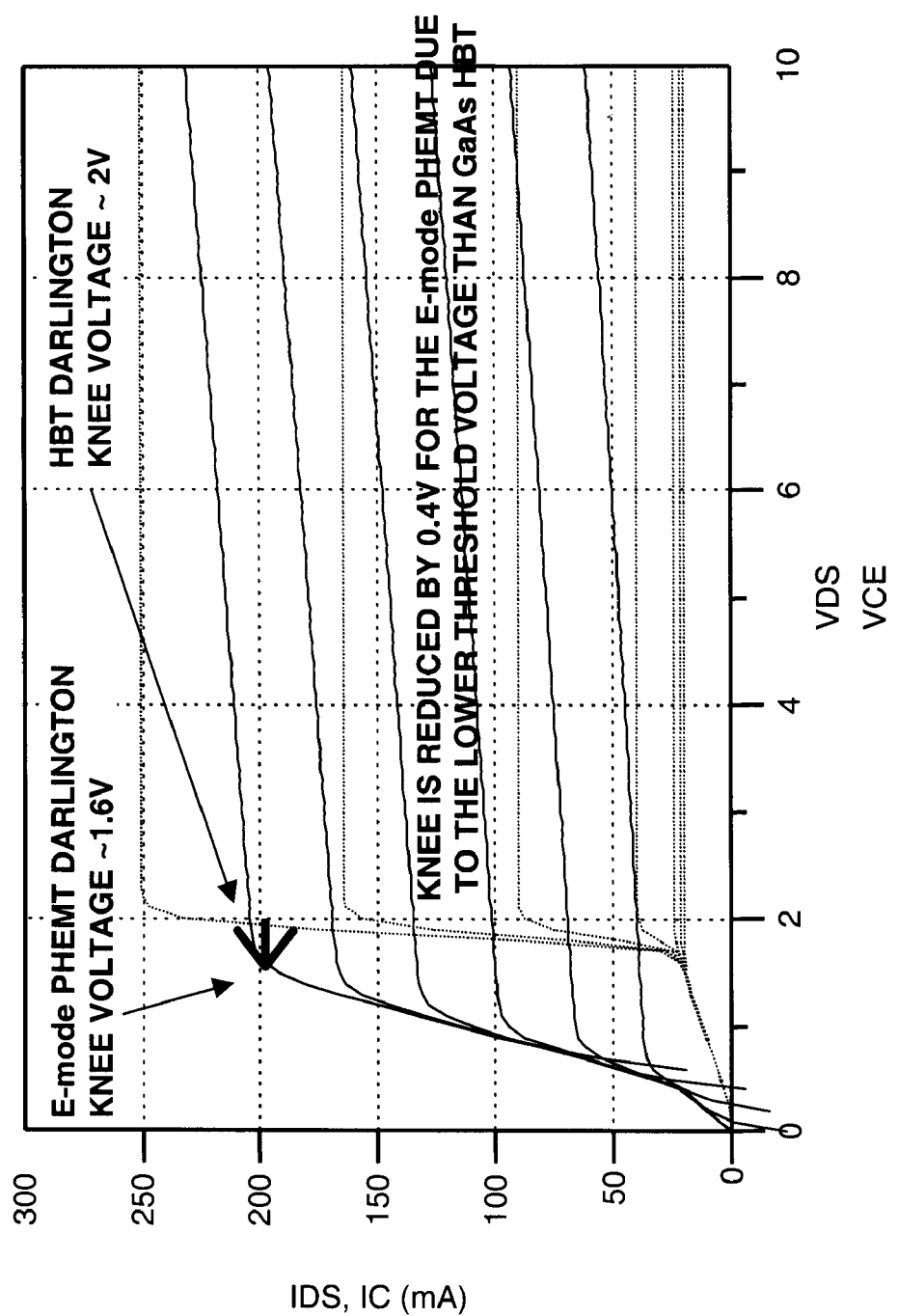
FIG. 5 illustrates the I-V characteristics of the Darlington of FIG. 4.

Referring to FIG. 5, a diagram illustrating the I-V characteristics of the system 30 compared to a GaAs HBT Darlington is shown. Due to the lower threshold voltage, the knee voltage of the PHEMT is reduced by roughly 0.4V compared to the GaAs HBT Darlington.

Figure 6:
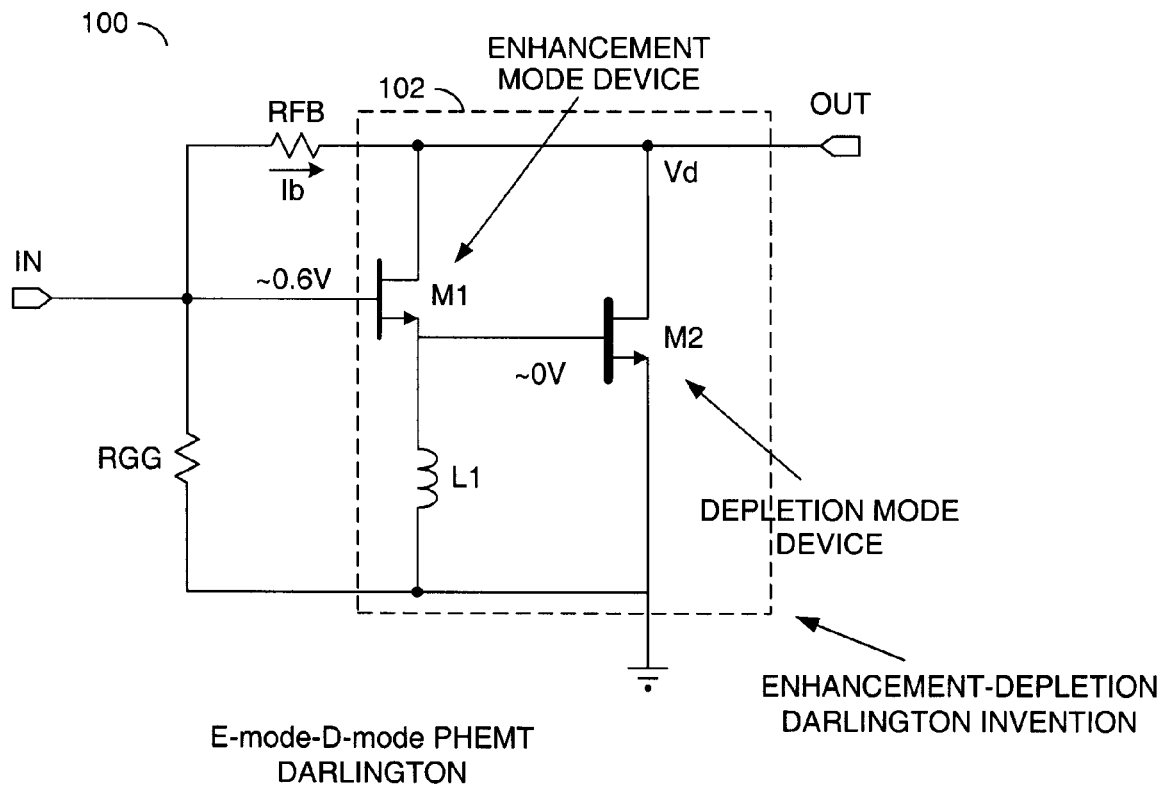
FIG. 6 is a block diagram of a system in accordance with a preferred embodiment of the present invention.

Referring to FIG. 6, a block diagram of a system 100 is shown in accordance with a preferred embodiment of the present invention. The system 100 illustrates a Darlington feedback amplifier where a Darlington cell 102 comprises a transistor M1, a transistor M2, and an optional inductor L1. The transistor M1 may be implemented as an enhancement-mode device. In one example, the transistor M1 may be implemented as a PHEMT transistor. The transistor M1 may be considered an input transistor. The transistor M2 may be implemented as a depletion-mode device. In one example, the transistor M2 may be implemented as a PHEMT transistor. The transistor M2 may be considered an output transistor. The transistor M1 may be configured to drive a gate of the transistor M2.

A gate of the transistor M1 may receive an input signal (e.g., IN). A drain of the transistor M1 and a drain of the transistor M2 are generally tied together and present an output signal (e.g., OUT). A source of the transistor M2 is normally coupled to ground. A source of the transistor M1 is normally coupled to ground through the inductor L1.

A gate bias of the output transistor M2 is roughly zero potential (or close to zero), in order to provide the Darlington 102 with full supply voltage headroom across the drain to source terminals of the input transistor M1. The voltage of the output signal OUT may swing all the way to near ground potential before the first stage transistor M1 saturates. The resulting I-V curve of the enhancement-depletion (E-D) Darlington system 100 normally has a knee voltage that is similar to a single stage common-source transistor amplifier. Such a knee voltage normally results in greater output power, higher linearity and increased efficiency.

In one example, the inductor L1 may be implemented on the source of the input stage enhancement-mode transistor M1. The inductor L1 may be referred to as source inductor. The inductor L1 may be implemented to allow true Darlington pair operation. The inductor L1 may be implemented to provide a high impedance such that the transistor M1 behaves more like a source follower than a common-source amplifier. In general, the larger the value of the inductor L1, the more the transistor pair M1 and M2 will behave like a traditional Darlington. In general, the lower the value of the inductor L1, the more the transistor M1 behaves like a common-source amplifier feeding another common-source amplifier. In general, medium values of the inductor L1 (e.g., with impedances ~100 ohms) at the frequency of interest will still resemble a Darlington amplifier. At low frequencies (e.g., below around 1 GHz), the Darlington 102 will behave more like a common-source amplifier.

A feedback resistor (e.g., RFB) and a bias resistor (e.g., RGG) may be implemented to form an E-D Darlington feedback amplifier circuit. The application of the E-D Darlington may be used in non-feedback amplifier applications while still offering low knee voltage and high output efficiency.

Figure 7:
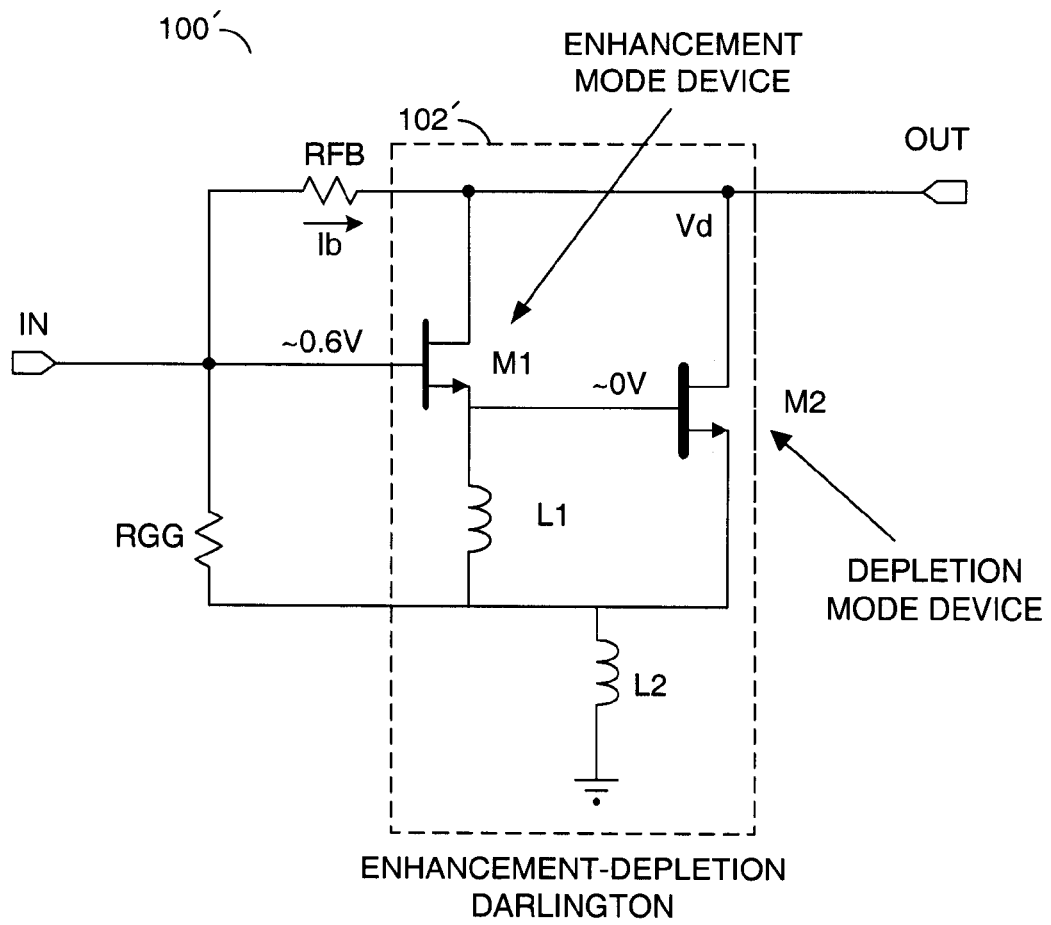
FIG. 7 is an alternate embodiment of the present invention.

Referring to FIG. 7, a system 100' illustrating a variation of the present invention is shown. In the system 100', the low knee voltage I-V characteristic of the Enhancement-Depletion Darlington 102' still holds, but the RF characteristics have changed. In the system 100', an inductor L2 may be connected between a node formed by one side of the resistor RGG, one side of the inductor L1 and a source of the transistor M2. The inductor L2 provides a series feedback for the E-D Darlington cell 102'. The value of the inductor L2 may be tuned to improve input and output return-loss, as well as to improve output IP3 and noise figure performance. The value of the induction L2 may be implemented by a wirebond or lead inductance of a package. In an extreme case, the value of the inductor L1 may be small or non-existent. In this case the E-D Darlington will behave as a composite common-source amplifier. The introduction of the inductor L2 may also serve, along with the inductor L1, to provide a broadband loss-less voltage divider, which may be used to optimize the signal driving the gate terminal of the D-mode transistor M2. For a high dynamic range application, this can be used to reduce the gain of the amplifier 100' and to improve input dynamic range (IIP3) without adversely impacting noise figure performance. This may help solve a common-problem for high transconductance amplifiers such as HBTs and PHEMT used in high dynamic range applications such as cable television.

In general, the linearity of the system 100' may be tuned by optimizing bias currents of the transistors M1 and M2, the area of the transistors M1 and M2, and the values of the inductors L1 and L2. In one example, small resistors (not shown) may be placed in series with the sources of the transistor M1 and M2 for tailoring RF performance, inhibiting inductor self-resonances, and providing an amount of bias stability.

Figure 8:
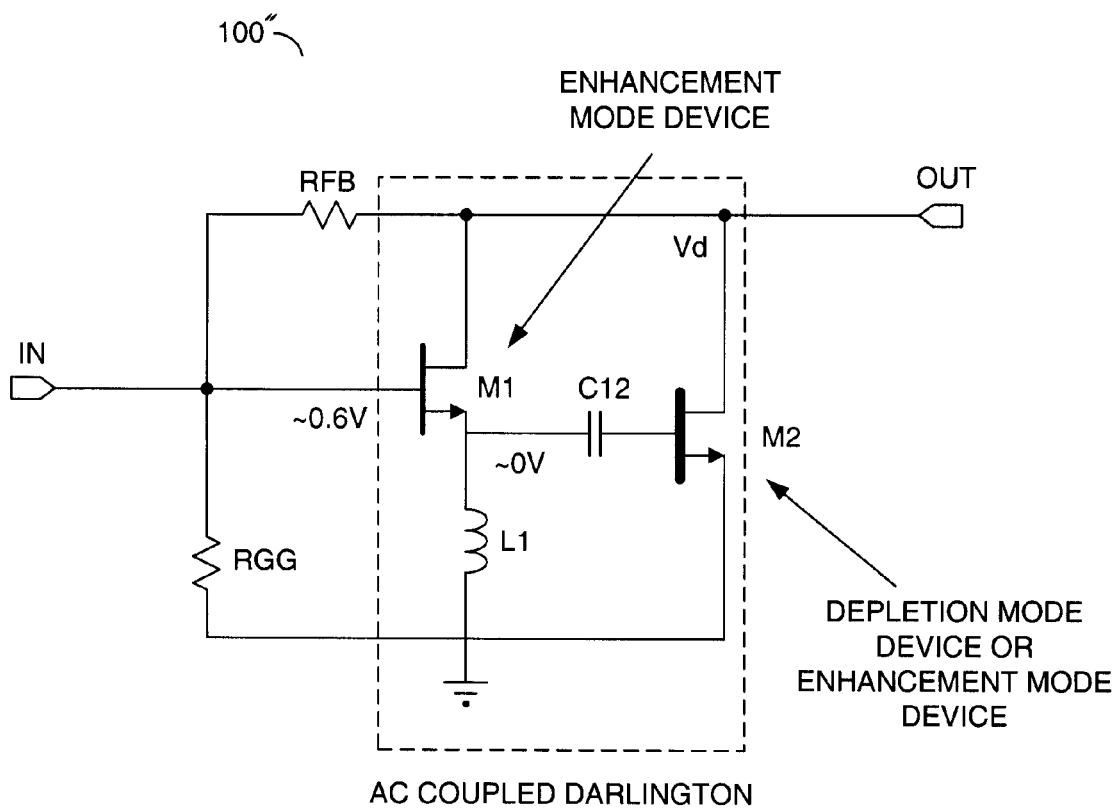
FIG. 8 is a diagram of an alternate embodiment of the present invention.

Referring to FIG. 8, a system 100" illustrates another embodiment of the present invention. The system 100" includes a capacitor C12. The capacitor C12 may be used to AC couple the first stage transistor M1 to the second stage transistor M2. AC coupling may allow each stage to be independently biased. Low knee voltage I-V characteristics may be obtained by biasing the source of the transistor M1 at roughly zero potential. Such biasing may be implemented by using the connection of the source inductor L1 to ground to provide a finite impedance. A high impedance would normally emulate a Darlington where the transistor M1 behaves as a source follower. A low impedance would normally emulate a pseudo-Darlington where the transistor M1 behaves somewhere in between a source follower and a common-source amplifier stage. In such a scenario, various current mirror-biasing schemes may be used to bias the independent stages. The output transistor M2 may operate as an Enhancement mode device. Such a configuration may also be applicable to bipolar or other technologies.

The system 100" may also implement separate biasing circuits (to be described in more detail in connection with FIGS. 9 and 10) for the input transistor M1 and the output transistor M2. Such biasing circuits may need an additional bias pin from the package. Such an extra pin may preclude application to transistor style packages like the SOT89, SOT86 and 76 ceramic pill package. In addition, the system 100" may be challenging to operate a very low frequencies due to the low source resistance of the transistor M1 driving the capacitor C12, which normally creates a high frequency high-pass pole. However, the system 100" may compensate for such disadvantages by providing application to other technologies, such as HBT bipolar semiconductors. Also, the system 100" does not normally need dissimilar threshold devices within the same process in order to implement a monolithic solution.

Figure 9:
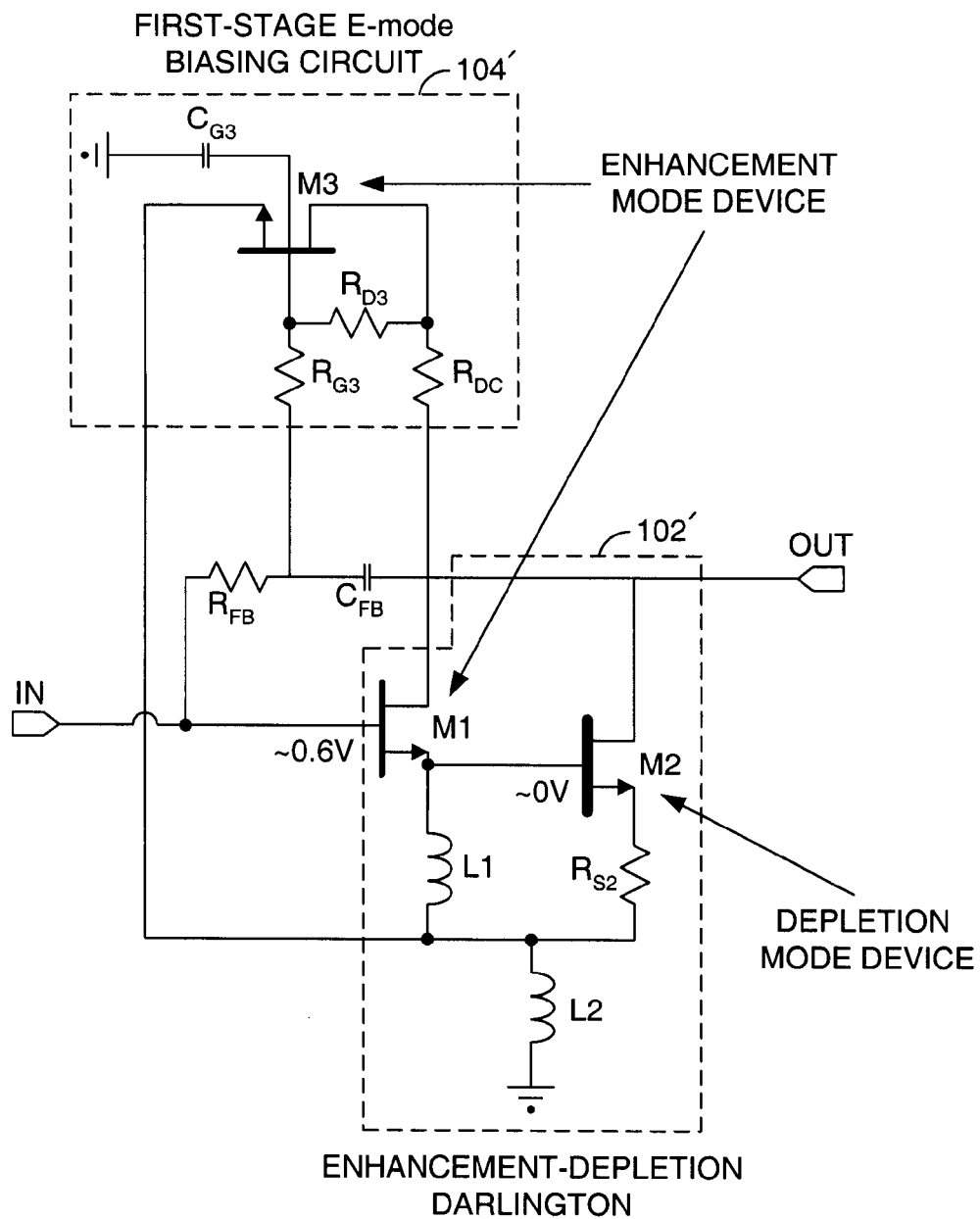
FIG. 9 is a more detailed diagram of the present invention.

Referring to FIG. 9, a more detailed diagram of the system 100' is shown. The system 100' is shown further comprising a circuit 104' and a resistor RS2. The circuit 104' may be implemented as a first stage E-mode self-bias circuit. The resistor RS2 may be implemented as a series source resistor. The self-bias circuit 104' generally comprises a transistor M3, a resistor RG3, a resistor RD3, a capacitor CG3, and a resistor RDC. The transistor M3 may be implemented as a mirror transistor. The resistor RG3 may be implemented as an isolation resistor. The resistor RD3 may be implemented as an isolation resistor. The capacitor CG3 may be implemented as a bypass capacitor. The resistor RDC may be implemented as a bias set resistor.

The circuit 104' may be implemented as a self-bias circuit. The self-bias circuit 104' normally sets the bias current of the transistor M1 through a mirror which is normally tapped between a capacitor CFB and the feedback resistor RFB. The capacitor CFB may be implemented as an output feedback capacitor. The location of the tap may be a unique feature and may provide a low noise implementation of the biasing scheme. The mirror transistor M3 may be implemented as an enhancement mode device. In general, the transistor M3 is implemented as the same type of transistor as the transistor M1. The mirror bias is normally set up through a resistor RDC that normally determines the current through the transistor M3. The resistor RDC may be implemented as a bias dropping resistor.

A ratio of the areas between the transistors M3 and the transistor M1 approximately determines the bias current through the first stage transistor M1. A series feedback resistor RS2 may be employed on the source of the output transistor M2. Such a series feedback resistor is found in many practical Darlington amplifiers which serves many purposes including providing (i) series feedback for determining gain and bandwidth response of the amplifier, (ii) bias stability over temperature, process, and supply, and (iii) thermal stability. In the system 100', the resistor RS2 may offer an extra degree of freedom for selecting the desired periphery of the output stage (for a given bias current) in order to optimize the output IP3 performance. In addition, the resistor RS2 offers a way for the gate to source bias voltage Vgs of the transistor M2 to be adjusted through a control circuit (to be described in more detail in connection with FIG. 10) for stabilizing the bias of the output transistor M2.

Figure 10:
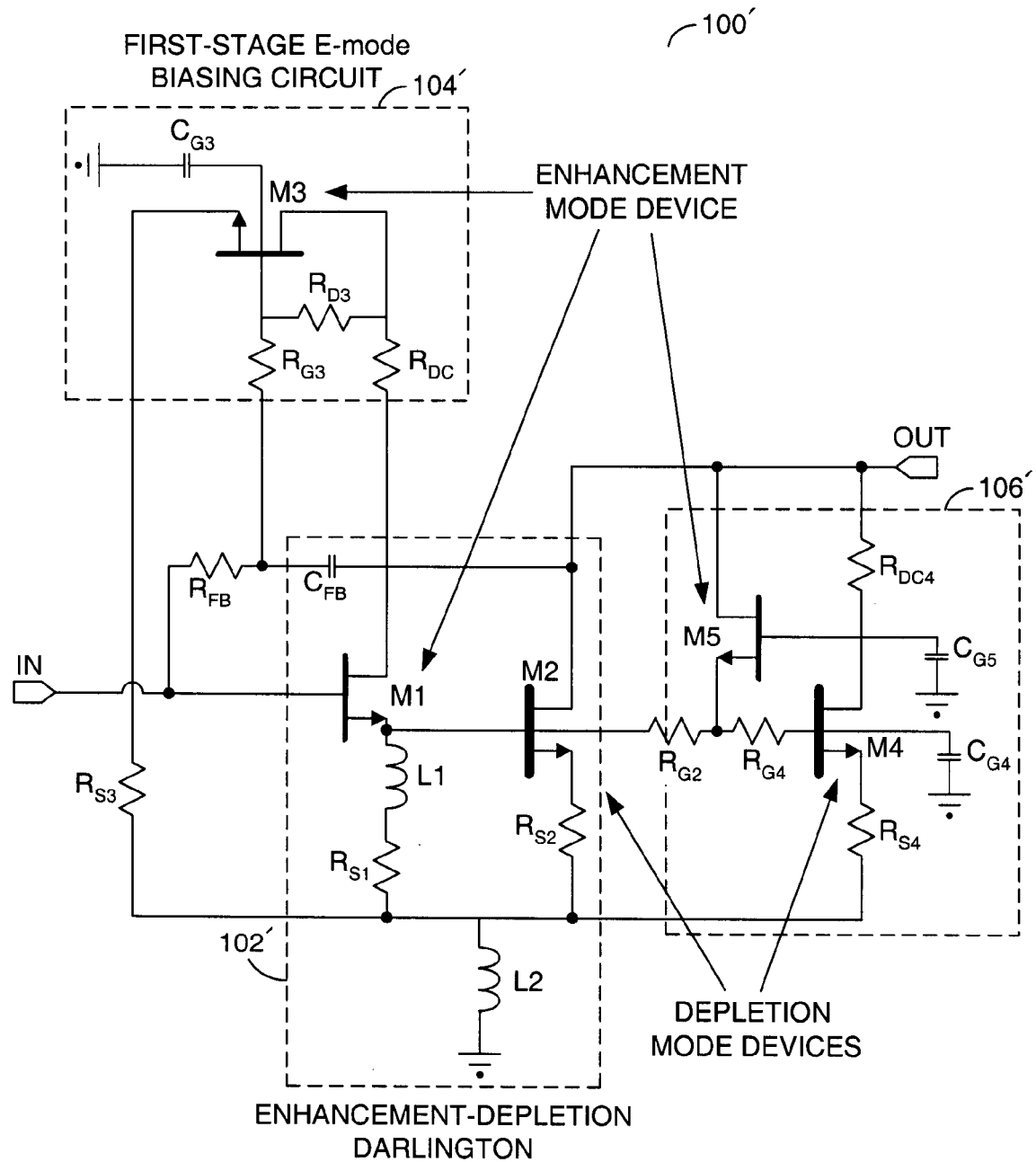
FIG. 10 illustrates a more detailed diagram of the present invention.

Referring to FIG. 10, a more detailed diagram of the system 100' is shown. The system 100' further comprises a circuit 106'. The circuit 106' may be implemented as a second stage biasing (or bootstrap) circuit. The circuit 106' may bias the transistor M2. The circuit 104' further comprises a resistor RS2. The circuit 106' further comprises a transistor M5, a resistor RDC4, a capacitor CG5, a resistor RG2, a resistor RG4, a resistor RS4 and a transistor M4. The added resistors RS1 and RS2 may provide source resistances in the source of the transistors M1 and M2 to enable the circuit 106'. The resistors RS1 and RS2 may drop ~0.1-0.2 V in order to allow the second stage current mirror biasing circuit 106' to bootstrap the output transistor M2 bias. An additional source bias resistor RS3 may be added to the first stage mirror biasing. The resistor RS3 is normally scaled with respect to the approximate area ratio of the transistor M1 over the transistor M3.

The circuit 106' may provide a biasing circuit by implementing a current mirror. The transistor M4 may be implemented as a mirror transistor. The resistors RG2 and RG4 may be implemented as isolation resistors. The resistor RS4 may be implemented as a source mirror resistance. The capacitors CG4 and CG5 may be implemented as bypass capacitors. The transistor M5 may be implemented as a level shifting enhancement mode device. The resistor RDC4 may be implemented as a DC bias set resistor. The DC set resistor may determine the bias current of the mirror transistor M4. The resistor RDC4 may be connected directly to a supply pin. The ratio of the transistors M4 to M2 and the source resistors RS4 to RS2 normally determines the approximate bias current of the output transistor M2. The bypass capacitors CG4 and CG5 may prevent the source follower signal of the transistor M1 and output voltage signal from modulating the bias of the transistors M4 and M2.

The bias bootstrap circuit 106' may be an optional circuit implemented in certain design applications to ensure bias stability. The need for the circuit 106' may depend on practical process variations and the nominal voltage drop across the resistor RS2. In certain design implementations, the circuit 106' may not be needed for the efficient operation of the Darlington feedback amplifier. While the circuit 106' has been shown implemented as a mirror biasing topology, other biasing schemes may be implemented to meet the design criteria of a particular implementation.

Figure 11:
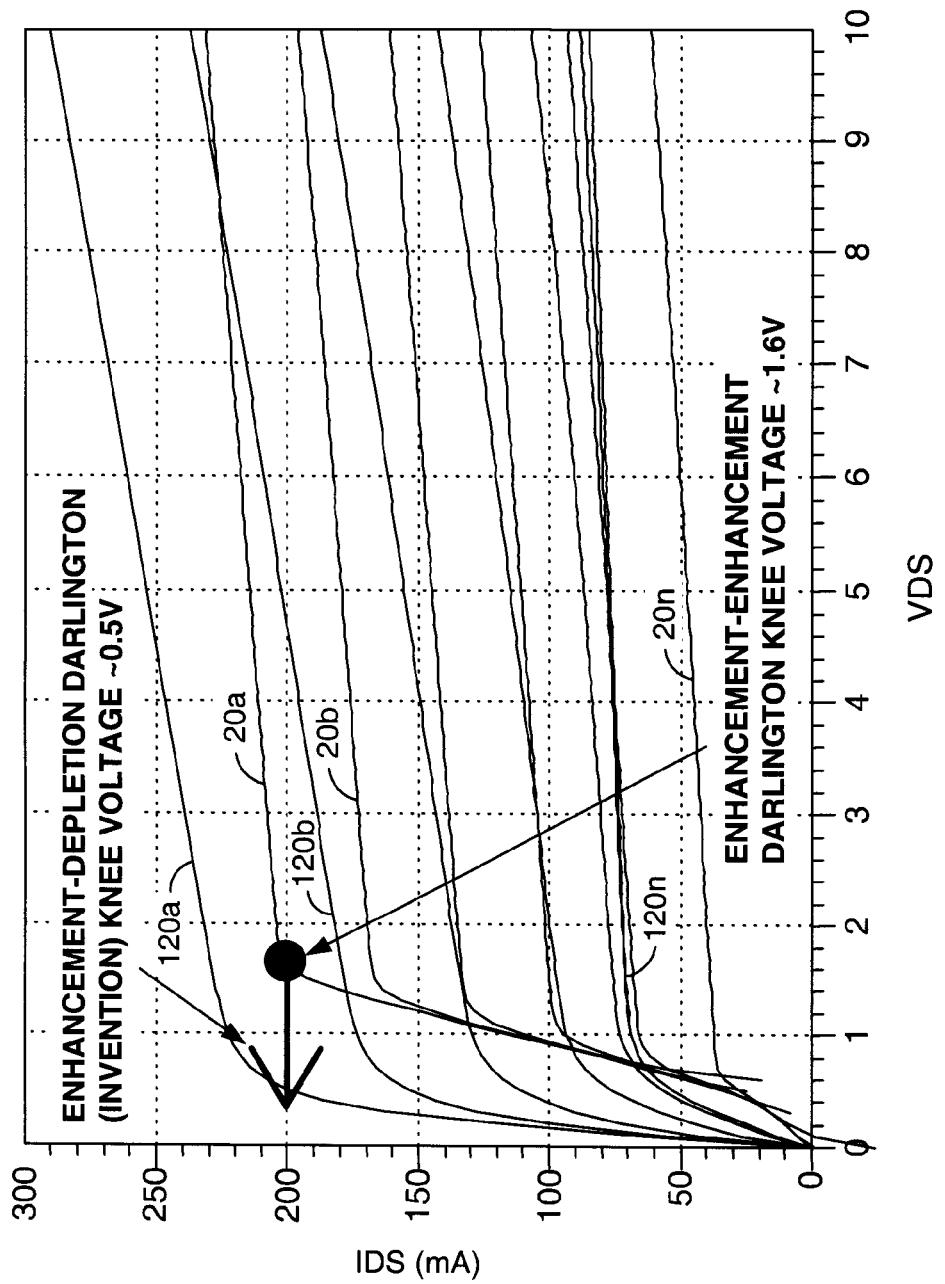
FIG. 11 is a graph comparing the I-V characteristics of the present invention compared with the E-mode PHEMT Darlington of FIG. 4.

Referring to FIG. 11, a graph illustrating simulated I-V characteristics of the present invention compared with the PHEMT Darlington of FIG. 4 is shown. The knee voltage of I-V curves 20a-20n of the E-E Darlington is ~1.6V (@200 mA) while the knee voltage of I-V curves 120a-120n of the E-D Darlington invention is only ~0.5V (@8200 mA), a 1.1V improvement. This is a significant improvement in knee voltage relative to a 5V quiescent supply voltage. Such an improvement may translate into improved peak-to-peak voltage swing over the E-E Darlington amplifier (to be described in more detail in connection with FIG. 12).

Figure 12:
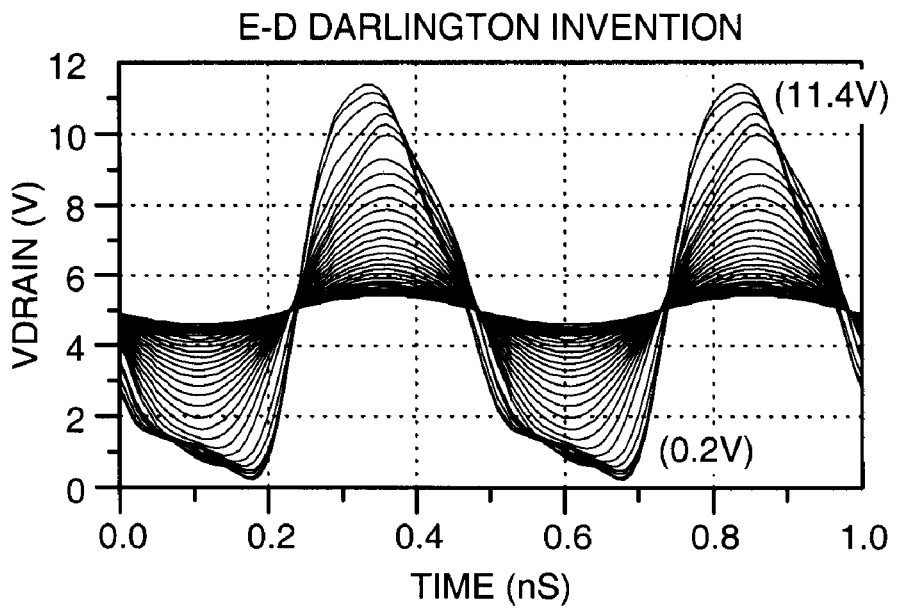
FIG. 12 is a graph comparing the RF voltage swing of the present invention compared with the E-mode PHEMT Darlington of FIG. 4.
Figure 12:
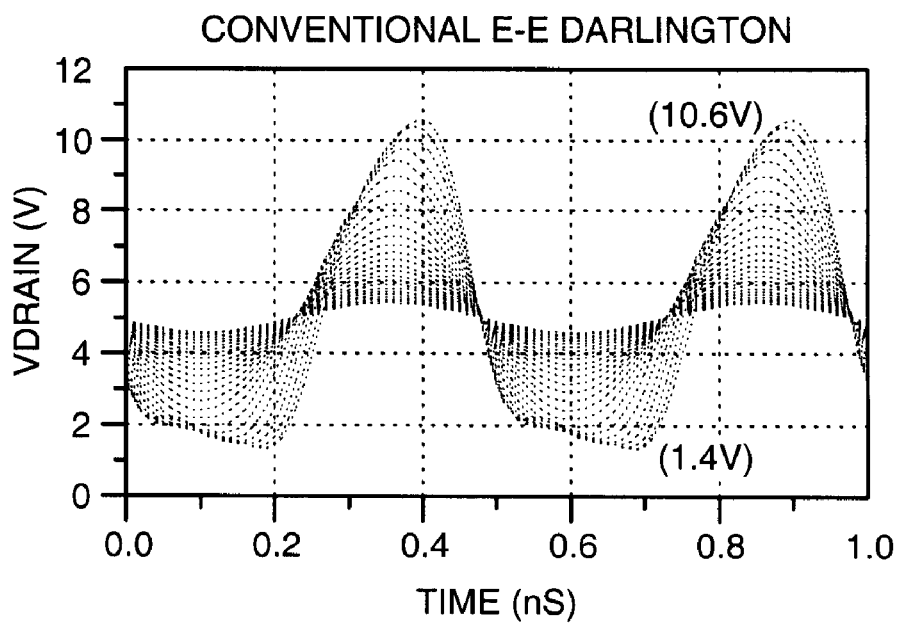

FIG. 12 illustrates the output RF voltage swing of the present invention compared with the E-E Darlington of FIG. 4. The E-D Darlington of the present invention allows a much bigger peak to peak output voltage swing as well as linear peak to peak voltage swing (where the signal is still sinusoidal). Due to the lower knee voltage of the E-D Darlington, the voltage can swing as low as 0.2V and as high as 11.4V. In comparison, the E-E Darlington is limited to a low voltage swing of 1.4V and a high voltage swing of 10.6V. This translates to improved output power (P1dB) and output linearity (IP3) for the E-D Darlington.

Figure 13:
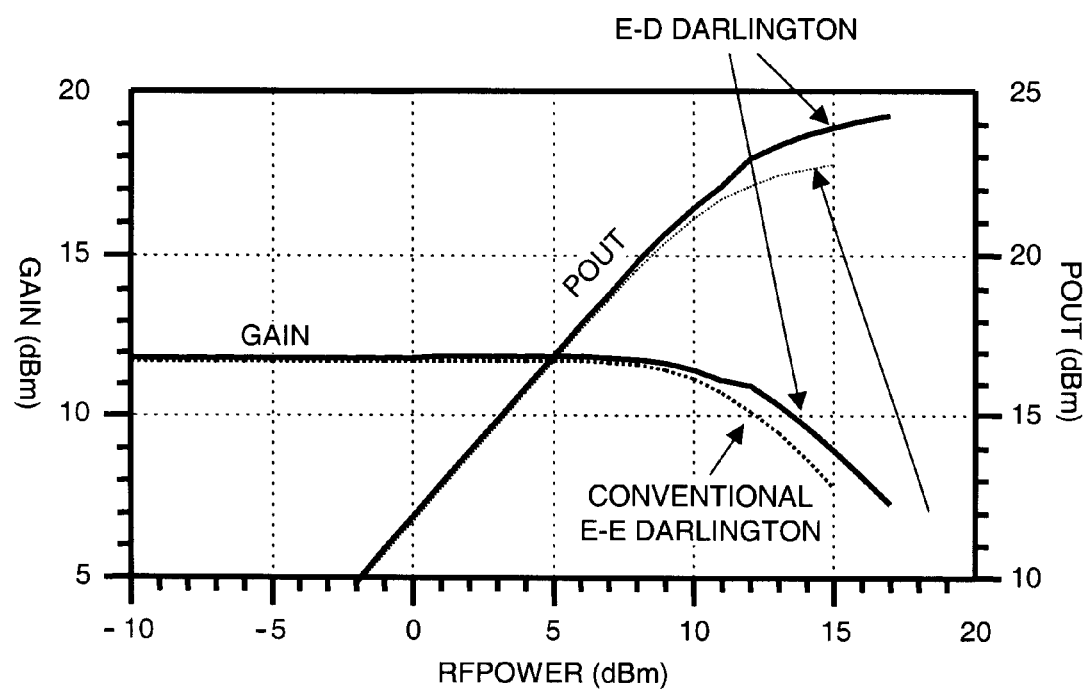
FIG. 13 shows a graph illustrating the output compression characteristics of the present invention versus the E-mode PHEMT Darlington of FIG. 4.

FIG. 13 illustrates the output compression characteristics of the E-D Darlington of the present invention compared with the E-E Darlington amplifier of FIG. 4. The E-E Darlington compresses earlier than the E-D Darlington amplifier of the present invention. The gain as well as the output power rolls off earlier in the E-E Darlington as the RF input power ramps up into compression. Quantitatively, the P1dB of the E-D Darlington is 23 dBm while the P1dB of the E-E Darlington is 21.7 dBm. This translates into a 1.3 dBm increase in output power capability. Larger improvements may be realized in other variants of the present invention. For example, removing or reducing the optional resistor RS2 may improve performance.

Figure 14:
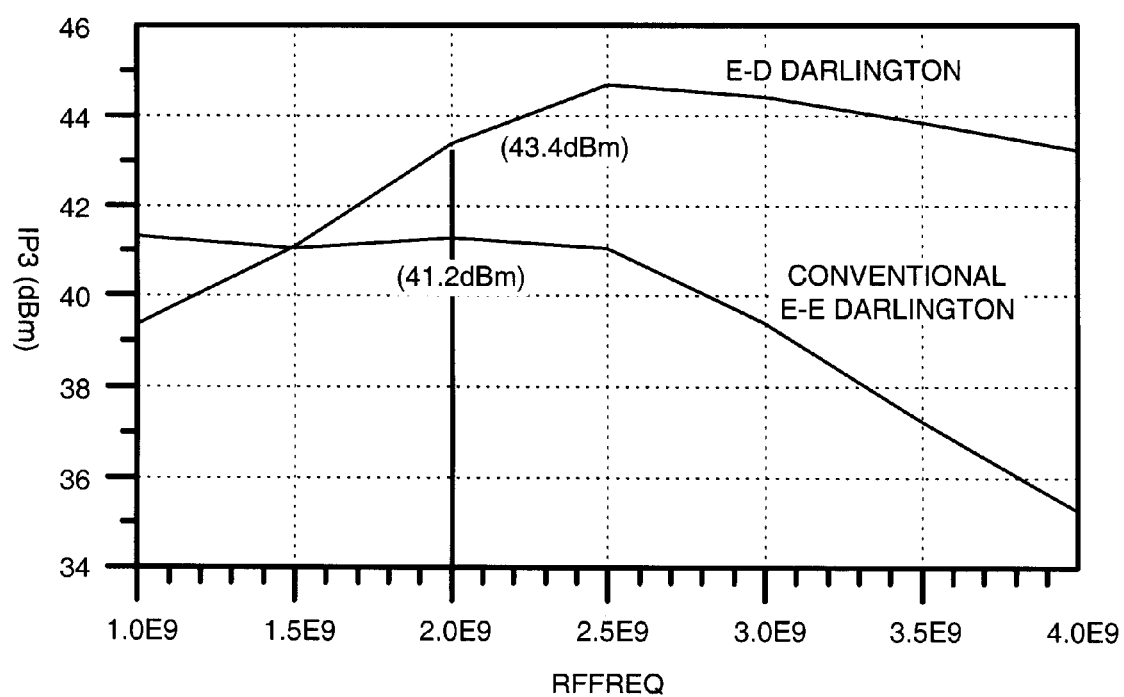
FIG. 14 is a graph illustrating the output IP3 linearity of the present invention compared with the E-mode PHEMT Darlington of FIG. 4.

FIG. 14 illustrates the output IP3 linearity of the E-D Darlington amplifier of the present invention and the E-E Darlington amplifier of FIG. 4. The IP3 is enhanced at higher frequencies for the E-D Darlington of the present invention. Specifically, at a frequency of 2 Ghz, the IP3 is 43.4 dBm (compared with the E-E Darlington that yields an IP3 of 41.2 dBm). The present invention increases IP3 by 2.2 dBm. At higher frequencies, the present invention normally achieves an even higher IP3 improvement of as much as 7 dBm. Below a certain low frequency point, the invention does not offer better IP3. The break point is due to the size of the inductors L1 and/or L2 which may limit the lower frequency of operation. The values of inductors L1 and/or L2 may be chosen to implement a commercial product without increasing the size of the die substantially (or at all) when compared to the conventional approach which utilizes source inductance for the output transistor.

The following TABLE 1 illustrates a comparison summary of simulated performance between the E-D PHEMT Darlington of the present invention and the E-E PHEMT Darlington of FIG. 4:

TABLE 1

| Parameter | Units | E-D PHEMT Darlington (Invention) | E-E PHEMT Darlington (FIG. 4) |
|---|---|---|---|
| Gain @ 2 GHz | dB | 11.8 | 11.8 |
| Input R.L. | dB | 13.3 | 18.6 |
| Output R.L. | dB | 11.6 | 15.2 |
| P1dB @ 2 GHz | dBm | 23 | 21.7 |
| OIP3 @ 2 GHz | dBm | 43.4 | 41.2 |
| Δ (IP3 − P1dB) | dB | 20.4 | 19.5 |
| NF @ 2 GHz | dB | 3.2 | 3.1 |
| Idd | mA | 130 | 130 |
| Vsupply | V | 5 | 5 |

The values shown may be generated using IP3 @~5 dBm per output tone. In general, for the same bias current and supply voltage, the E-D PHEMT Darlington achieves better P1dB and IP3 performance without compromising gain, return-loss, or noise figure performance. The present invention may be modified to provide simulation results with 2-3 dB improvement.

The present invention may also be applied to different supply current configurations and different E-D technologies. Improvements as great as 3-6 dB compared with the system of FIG. 4 may be achieved from a Darlington of the present invention. In one example, the present invention may be applied to GaN or other still evolving technologies.

The E-D Darlington of the present invention may have a number of applications. For example, high linearity infrastructure drivers with enhanced IP3 may be implemented. The present invention may provide a general purpose high IP3 amplifier that may be used to implement efficient LO, RF, IF buffer amplifiers. Integrated ED PHEMT utility gain blocks may also be implemented. The present invention may be combined with advanced litho (<0.25 um) ED PHEMT to replace standard BB-20 GHz Distributed amplifiers. Efficient, lower supply applications may be implemented. The present invention may be combined with future E-D GaN to construct high efficiency—broadband-high dynamic range LNAs and PAs for software reconfigurable communication systems.

While the present invention has been described as an enhancement first stage and depletion second stage, depletion first stage and enhancement second stage may also be implemented. An enhancement second stage may provide a 0 DC bias input that may be directly coupled to a preceding IC, such as in digital, fiber optic, and/or instrumentation systems. The present invention may be implemented without additional supply voltages (as needed in the conventional circuits discussed).

While the invention has been particularly shown and described with reference to the preferred embodiments thereof, it will be understood by those skilled in the art that various changes in form and details may be made without departing from the spirit and scope of the invention. For example, other embodiments of the invention may be created involving darlington amplifiers, amplifiers in general, and 3 terminal device applications without departing from the general scope and spirit of this invention.

The invention claimed is:

1. An apparatus comprising:
 a Darlington transistor pair comprising (a) a first transistor having a gate configured to receive an input signal, (b) a second transistor having a gate coupled to a source of said first transistor and (c) an inductor element coupled to said source of said first transistor, wherein (i) said Darlington transistor pair is configured to generate an output signal at a drain of said first transistor and a drain of said second transistor in response to said input signal and (ii) said first transistor comprises an enhancement mode device and said second transistor comprises a depletion mode device.

2. The apparatus according to claim 1, further comprising:
a second inductor element coupled to said source of said second transistor.

3. The apparatus according to claim 2, wherein the second inductor is coupled to a first inductor element to provide a broadband voltage divider for adjusting the RF signal being applied to the second transistor.

4. The apparatus according to claim 1, further comprising:
a bias circuit coupled to said first transistor.

5. The apparatus according to claim 1, further comprising:
a bias circuit coupled to said second transistor.

6. The apparatus according to claim 1, wherein (i) said first transistor comprises (i) a depletion mode transistor and (ii) said second transistor comprises an enhancement mode transistor.

7. The apparatus according to claim 6, wherein said apparatus is directly coupled to an external circuit through said gate of said first transistor, wherein said gate has a substantially 0V DC bias.

8. The apparatus according to claim 6, wherein said apparatus is configured to be an external Integrated Circuit (IC).

9. The apparatus according to claim 1, wherein first and second transistors are manufactured using a processing technology selected from the group consisting of GaN, SiC, PHEMT and other semiconductor device technologies.

10. The apparatus according to claim 1, wherein (i) said first transistor is AC coupled to said second transistor through a first capacitor and (ii) a first inductor is coupled between the source of the first transistor and ground.

11. The apparatus according to claim 1, wherein said apparatus minimizes a knee voltage of said Darlington transistor pair.

12. The apparatus according to claim 1, wherein said apparatus is configured to provide a linear output.

13. The apparatus according to claim 1, wherein said apparatus operates like a single transistor device.

14. The apparatus according to claim 1, wherein said apparatus provides a knee voltage similar to a single transistor common-source device.

15. The apparatus according to claim 1, further comprising:
a spiral inductor connected to said source of said first transistor to provide a high RF impedance and a low DC impedance.

16. An apparatus comprising:
a Darlington transistor pair comprising a first transistor having a gate configured to receive an input signal and a second transistor having a gate coupled to a source of said first transistor, wherein (i) said Darlington transistor pair is configured to generate an output signal at a drain of said first transistor and a drain of said second transistor in response to said input signal, (ii) said first transistor comprises an enhancement mode device and said second transistor comprises a depletion mode device, (iii) said first transistor is AC coupled to said second transistor through a first capacitor and (iv) a first inductor is coupled between the source of the first transistor and ground.

17. The apparatus according to claim 16, wherein (i) said first transistor comprises (i) a depletion mode transistor and (ii) said second transistor comprises an enhancement mode transistor.

18. An apparatus comprising:
a Darlington transistor pair comprising (a) a first transistor having a gate configured to receive an input signal, (b) a second transistor having a gate coupled to a source of said first transistor and (c) a spiral inductor connected to said source of said first transistor to provide a high RF impedance and a low DC impedance, wherein (i) said Darlington transistor pair is configured to generate an output signal at a drain of said first transistor and a drain of said second transistor in response to said input signal and (ii) said first transistor comprises an enhancement mode device and said second transistor comprises a depletion mode device.

19. The apparatus according to claim 18, wherein (i) said first transistor comprises (i) a depletion mode transistor and (ii) said second transistor comprises an enhancement mode transistor.

* * * * *